United States Patent
Deshpande et al.

(10) Patent No.: US 6,512,266 B1
(45) Date of Patent: Jan. 28, 2003

(54) METHOD OF FABRICATING SIO₂ SPACERS AND ANNEALING CAPS

(75) Inventors: Sadanand V. Deshpande, Fishkill, NY (US); Bruce B. Doris, Brewster, NY (US); Rajarao Jammy, Wappingers Falls, NY (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/902,830

(22) Filed: Jul. 11, 2001

(51) Int. Cl.⁷ .............................................. H01L 29/76
(52) U.S. Cl. ...................... 257/333; 257/346; 257/387; 257/340; 257/412; 257/388; 438/585
(58) Field of Search .................... 257/333, 346, 257/387, 388, 340, 900, 412; 438/585

(56) References Cited

U.S. PATENT DOCUMENTS

| 5,880,500 A | 3/1999 | Iwata et al. ................. 257/336 |
| 5,895,246 A | * 4/1999 | Lee ............................. 438/305 |
| 5,936,279 A | * 8/1999 | Chuang ....................... 257/346 |
| 6,010,954 A | 1/2000 | Ho et al. ..................... 438/596 |
| 6,034,388 A | 3/2000 | Brown et al. ................ 257/296 |
| 6,087,706 A | 7/2000 | Dawson et al. ............. 257/520 |
| 6,121,100 A | 9/2000 | Andideh et al. ............ 438/305 |
| 6,127,712 A | * 10/2000 | Wu ............................. 257/410 |
| 6,153,485 A | 11/2000 | Pey et al. .................... 438/305 |
| 6,160,299 A | 12/2000 | Rodder ....................... 257/408 |

OTHER PUBLICATIONS

"Preservation of Integrity of Protective Coatings During Anneal in Oxygen–Free Ambients," IBM Technical Disclosure Bulletin, vol. 30, No. 5, pp. 328–329, Oct. 1987.

* cited by examiner

Primary Examiner—Nathan J. Flynn
Assistant Examiner—Scott R. Wilson
(74) Attorney, Agent, or Firm—Margaret A. Pepper (57) ABSTRACT

Divot fill methods of incorporating thin SiO₂ spacer and/or annealing caps into a complementary metal oxide semiconductor (CMOS) processing flow are provided. In accordance with the present invention, the divot fill processes provide a means for protecting the exposed surfaces of the thin SiO₂ spacer and/or annealing cap such that those surfaces are not capable of being attacked by a subsequent silicide pre-cleaning step. CMOS devices including thin SiO₂ spacer and/or annealing caps whose surfaces are protected such that those surfaces are not capable of being attacked by a subsequent silicide pre-cleaning or other process steps are also provided.

24 Claims, 7 Drawing Sheets

METHOD OF FABRICATING SiO₂ SPACERS AND ANNEALING CAPS

DESCRIPTION

Field of the Invention

The present invention relates to complementary metal oxide semiconductor (CMOS) devices, and more particularly to metal oxide semiconductor field effect transistors (MOSFETs) that include an oxide spacer to reduce parasitic capacitance and an annealing cap that prevents dopant loss in the gate material during an activation-annealing step. The present invention also provides methods of manufacturing the CMOS devices of the present invention.

BACKGROUND OF THE INVENTION

In the semiconductor industry thin, SiN spacers are typically used to implant source/drain extensions (SDE) and halos for CMOS devices. The use of $SiO_2$ spacers is advantageous compared to SiN spacers because the lower dielectric constant of $SiO_2$ reduces the parasitic capacitance between the gate and S/D regions.

Annealing caps are used to protect the patterned gate stack, source/drain (S/D) and SDE regions from dopant loss during activation annealing. The utilization of a deposited oxide material as the annealing cap is advantageous since low energy implantation can be performed through the bare Si substrate. After the implant, a low temperature $SiO_2$ film may be deposited over the entire wafer to prevent dopant loss during annealing. The $SiO_2$ cap also serves as an etch stop for the thicker SiN spacer formation used to implant the S/D regions. As in the case of the thin $SiO_2$ spacer, the $SiO_2$ annealing cap reduces the parasitic capacitance between the gate and S/D regions. Simulations have shown that switching from a nitride annealing cap to an oxide annealing cap improves the ring oscillation delay by as much as 5%.

A major problem of integrating thin $SiO_2$ spacers and/or $SiO_2$ annealing caps into prior art processes is that any $SiO_2$ that is exposed during the pre-silicide cleaning or other process steps may be excessively etched. In the case of the thin $SiO_2$ spacer, excessive etching may cause the entire $SiO_2$ spacer to be removed thus leaving Si substrate area exposed. This leads to gate to substrate shorting by silicide bridging. In the case of the $SiO_2$ annealing cap, if the etching is excessive then the thick SiN spacers are undercut and may become completely detached rendering the device inoperable. This leads to silicide bridging since the spacers are present to prevent this from occurring.

In view of the above, there is a continued need for developing a new and improved method wherein thin $SiO_2$ spacers and/or annealing caps can be integrated into a CMOS processing flow without exhibiting any of the problems mentioned hereinabove.

SUMMARY OF THE INVENTION

One object of the present invention is to provide a method of forming a CMOS device in which a thin $SiO_2$ spacer and/or annealing cap is employed.

Another object of the present invention is to provide a method of forming a CMOS device in which the thin $SiO_2$ spacer and/or annealing cap is not aggressively attacked during the silicide pre-cleaning step or other process.

These and other objects and advantages are achieved in the present invention by utilizing a divot fill process which overcomes the above-mentioned drawbacks in the prior art. In accordance with the present invention, the divot fill process provides a means for protecting the exposed surfaces of the thin $SiO_2$ spacer and/or annealing cap such that those surfaces are not capable of being attacked by a subsequent silicide pre-cleaning or other process steps.

Specifically, a first method of the present invention, which forms an $SiO_2$ annealing cap, comprises the steps of:

(a) forming an oxide film on vertical and horizontal surfaces of a semiconductor structure, said semiconductor structure comprises at least a semiconductor substrate having at least one patterned gate stack region formed thereon;

(b) forming thick spacers on portions of said oxide film that are adjoining said at least one patterned gate stack region, said thick spacers being composed of a dielectric material other than an oxide;

(c) recessing said oxide film so as to form at least a divot region between said thick spacers and a top surface of said patterned gate stack region; and (d) forming a divot fill material in said divot region, said divot fill material being composed of a dielectric material other than an oxide. Note that in the first method of the present invention, the oxide film remaining in the structure after the recessing step is in the shape of the letter "L". Hence, the oxide film remaining in the structure after recessing is present on portions of the vertical sidewalls of the patterned gate stack region as well as on a portion of the semiconductor substrate.

The first method of the present invention provides a CMOS device which comprises:

a semiconductor structure having at least one patterned gate stack region formed thereon, said patterned gate stack region having vertical sidewalls;

an oxide film formed on portions of said vertical sidewalls of said at least one patterned gate stack region as well as portions of said semiconductor substrate;

thick spacers formed on said oxide film, wherein said thick spacers extend beyond edges of said oxide film such that a divot region is present between at least said thick spacers and a top surface of said patterned gate stack region; and a divot fill material present in said divot region.

A second method of the present invention, which forms a thin $SiO_2$ spacer and/or annealing cap comprises the steps of:

(a) forming an oxide film on vertical and horizontal surfaces of a semiconductor structure, said semiconductor structure comprises at least a semiconductor substrate having at least one patterned gate stack region formed thereon;

(b) etching said oxide film so as to remove said oxide fill from said horizontal surfaces of said structure;

(c) forming thick spacers on portions of said oxide film that are adjoining said at least one patterned gate stack region, said thick spacers being composed of a dielectric material other than an oxide;

(d) recessing said oxide film so as to form at least a divot region between said thick spacers and a top surface of said patterned gate stack region; and (e) forming a divot fill material in said divot region, said divot fill material being composed of a dielectric material other than an oxide.

The second method of the present invention provides a CMOS device which comprises:

a semiconductor structure having at least one patterned gate stack region formed thereon, said patterned gate stack region having vertical sidewalls;

an oxide film formed on portions of said vertical sidewalls of said at least one patterned gate stack region;

thick spacers formed on said oxide film and said semiconductor substrate, wherein said thick spacers extend beyond edges of said oxide film such that a divot region is present between at least said thick spacers and a top surface of said patterned gate stack region; and a divot fill material present in said divot region.

DETAILED DESCRIPTION OF THE INVENTION

The present invention, which relates to CMOS devices containing oxide spacers and/or annealing caps and methods of fabricating the same, will now be described in more detail by referring to the drawings that accompany the present application. It is noted that in the accompanying drawings, like and/or corresponding elements are referred to by like reference numerals.

Figure 1A:
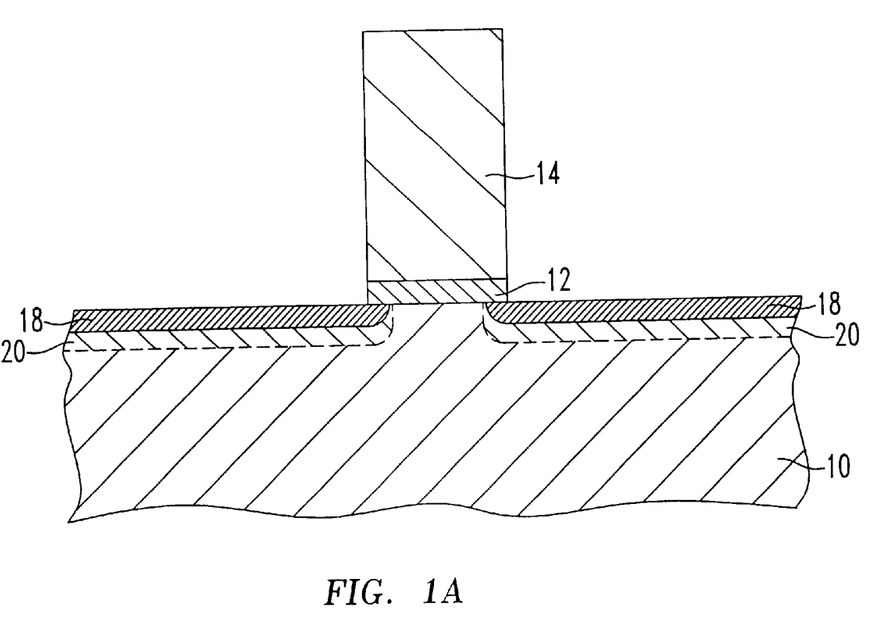
FIGS. 1A–1F are pictorial representations (through cross-sectional views) illustrating the inventive CMOS device through various processing steps employed in the first method of the present invention.

Reference is first made to the embodiment depicted in FIGS. 1A–1F which illustrate a first method of the present invention wherein an $SiO_2$ annealing cap is formed. Specifically, FIG. 1A illustrates an initial structure that is employed in the present invention. The initial structure shown in FIG. 1A comprises semiconductor substrate 10, patterned gate dielectric 12 formed on a portion of semiconductor substrate 10, and patterned gate stack 14 formed atop patterned gate dielectric 12. It is noted that although the drawings depict the presence of only one patterned gate region (i.e., patterned gate dielectric and patterned gate stack) on the semiconductor substrate, the present invention works in cases wherein a plurality of patterned gate regions are present on the semiconductor substrate.

The structure shown in FIG. 1A is comprised of conventional materials well known in the art and the illustrated structure is fabricated utilizing processing steps that are also well known in the art. For example, semiconductor substrate 10 is comprised of a semiconductor material including, but not limited to: Si, Ge, SiGe, GaAs, InAs, InP and all other III/V semiconductor compounds. Semiconductor substrate 10 may also include a layered substrate comprising the same or different semiconductor material, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions or other like regions that are typically present in CMOS-containing devices. For clarity, these regions are not shown in the drawings, but are nevertheless meant to be included within region 10. In one highly preferred embodiment of the present invention, semiconductor substrate 10 is comprised of Si.

Next, a layer of gate dielectric material such as an oxide, nitride, oxynitride or any combination and multilayer thereof is then formed on a surface of semiconductor substrate 10 utilizing a conventional process well known in the art. For example, the layer of gate dielectric material may be formed utilizing a conventional deposition process such as chemical vapor deposition (CVD), plasma-assisted CVD, evaporation or chemical solution deposition, or alternatively, the gate dielectric material may be formed by a thermal growing process such as oxidation, nitridation or oxynitridation. It is noted that the gate dielectric material will be subsequently patterned and etched into patterned gate dielectric 12 shown in FIG. 1A.

The thickness of the layer of gate dielectric material is not critical to the present invention, but typically, the gate dielectric material has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Al or combinations thereof may be employed. In one highly preferred embodiment of the present invention, gate dielectric 12 is comprised of an oxide such as $SiO_2$, $ZrO_2$, $Ta_2O_5$ or $Al_2O_3$.

After forming the gate dielectric material on the surface of semiconductor substrate 10, gate stack 14 which includes at least a gate material is formed on the gate dielectric material. The term "gate material" as used herein denotes a conductive material, a material that can be made conductive via a subsequent process such as ion implantation, or any combination thereof. Illustrative examples of suitable gate materials include, but are not limited to: polysilicon, amorphous silicon, elemental metals that are conductive such as W, Pt, Pd, Ru, Rh and Ir, alloys of these elemental metals, silicide or nitrides of these elemental metals and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of the gate dielectric material utilizing a conventional deposition process including, but not limited to: CVD, plasma-assisted CVD, evaporation, plating or chemical solution deposition. When metal silicides are employed, a conventional silicide process may be used in forming the silicide layer. One such silicide process that can be used in the present invention includes the steps of: first forming an elemental metal on the gate dielectric material, annealing the layers so as to form a metal silicide layer therefrom, and removing any unreacted elemental metal utilizing a conventional wet etch process that has a high selectivity for removing elemental metal as compared to silicide.

When polysilicon is employed as the gate material, the polysilicon layer may be formed utilizing an in-situ doping deposition process or by a conventional deposition process followed by ion implantation. Note that the ion implantation step may be formed immediately after deposition of the polysilicon layer, or in a later step of the present invention, i.e., after patterning of the gate stack.

It is noted that in embodiments wherein a gate stack including a layer of polysilicon and a layer of conductive elemental metal is employed, an optional diffusion barrier (not shown in the drawings) may be formed between each layer of the gate stack. The optional diffusion barrier, which is formed utilizing a conventional deposition process such as CVD or plasma-assisted CVD, is comprised of a material such as SiN, TaN, TaSiN, WN, TiN, and other like materials which can prevent diffusion of a conductive material therethrough.

After forming the gate stack on the gate dielectric material, the gate stack and the gate dielectric are then patterned utilizing conventional processing steps well known in the art which are capable of forming the patterned structure shown in FIG. 1A. Specifically, the structure shown in FIG. 1A is formed by lithography and etching.

The lithography step includes the following: applying a photoresist (not shown in the drawings) to the top surface of the gate stack, exposing the photoresist to a pattern of radiation and developing the pattern utilizing a conventional resist developer solution.

Etching is performed utilizing a conventional dry etching process such as reactive-ion etching, plasma etching, ion beam etching, laser ablation or a combination thereof. The etching step may remove portions of the gate stack and the underlying gate dielectric material that are not protected by the patterned photoresist in a single step, or alternatively, multiple etching steps may be performed wherein the exposed portions of the gate stack is first removed stopping on a surface of the gate dielectric material, and thereafter the exposed portions of the gate dielectric are removed stopping on the surface of semiconductor substrate 10. Following the etching process, the patterned photoresist is removed utilizing a conventional stripping process well known in the art providing the structure shown, for example, in FIG. 1A.

At this point of the present invention, source/drain extension and halo implants may be performed. Note in FIG. 1A, region 18 denotes the source/drain extension regions and region 20 denotes the halo implant region. In other embodiment of the present invention, the source/drain extension and halo implant implants may be formed after the structure shown in FIG. 1B is formed.

Figure 1B:
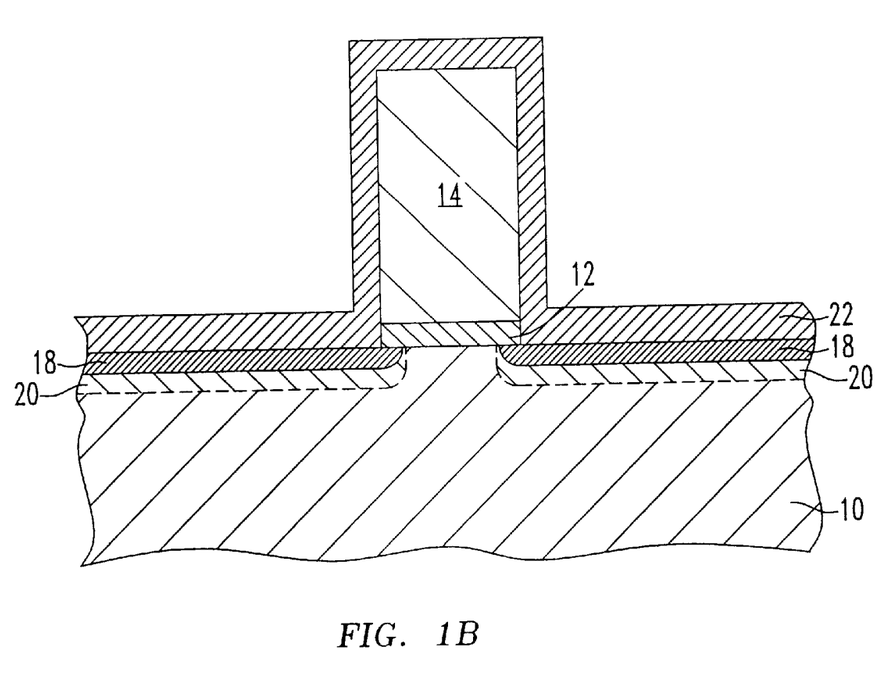
Figure 1C:
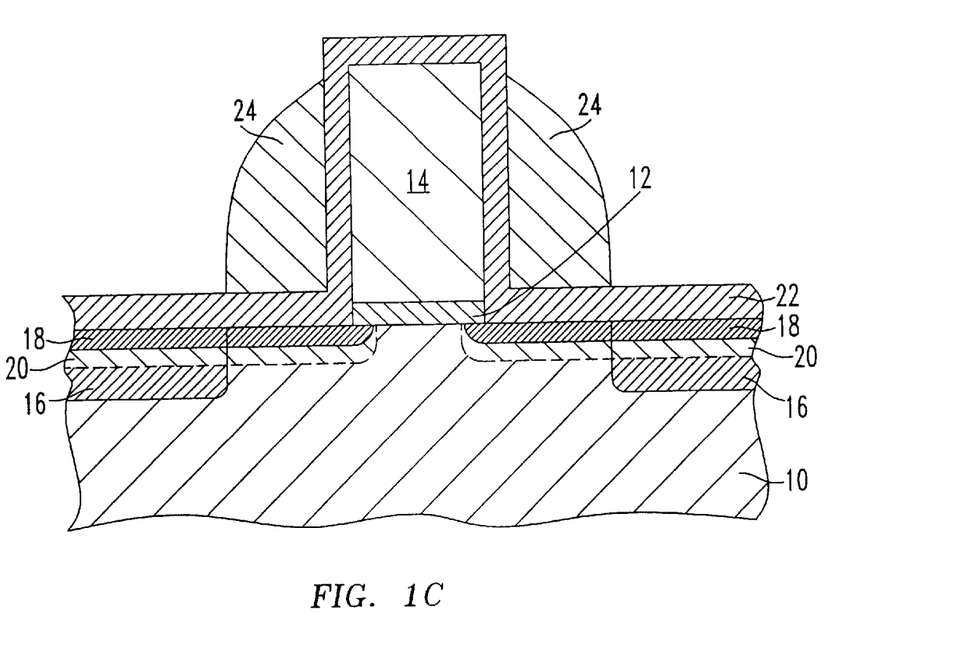

Note that the deep source/drain diffusion regions (labeled as 16 in FIG. 1C) are formed utilizing conventional processes (i.e., ion implantation and annealing) anytime after the structure shown in FIG. 1C is formed, i.e., after thick spacers 24 are formed in the structure.

In another embodiment of the present invention, the structure illustrated in FIG. 1A is subjected to a conventional reoxidation process prior to proceeding to the next step of the present invention.

FIG. 1B illustrates the structure after oxide film 22 is formed over the patterned gate stack structure of FIG. 1A. The oxide film, which is the annealing cap or thin inner spacer of the inventive structure, is formed utilizing any conformal deposition process that is capable of depositing a film that follows the contour of the structure shown in FIG. 1A. Specifically, CVD, plasma-assisted CVD, evaporation or chemical solution deposition may be employed in forming oxide film 22 on the structure.

In one embodiment of the present invention, fluorine or nitrogen-containing dopants may be incorporated (via ion implantation or another conventional process) into oxide film 22 so as to alter the dielectric constant of oxide film 22. A highly preferred oxide film employed in the present invention is a film that is comprised of $SiO_2$, which may or may not be doped with fluorine or nitrogen.

The thickness of oxide film 22 is not critical to the present invention, but typically oxide film 22 has a thickness of from about 2 Å to about 40 nm, with a thickness of from about 5 to about 10 nm being more highly preferred.

At this point of the present invention, an annealing step may be performed to activate the dopants, if implanted, and to possibly heal the implant damage. The activation-annealing step is conducted utilizing conditions well known in the art. For example, activation annealing at a temperature of about 900° C. or greater for a time period of about 30 seconds or less may be employed at this point of the present invention. Additionally, the various implants steps mentioned hereinabove may also be performed at this point of the present invention.

Next, thick spacers 24, which may include a single spacer material or a combination of spacer materials, are formed on the oxide film that abuts the patterned gate stack so as to provide the structure shown in FIG. 1C. The thick spacers are formed of a dielectric material other than an oxide. Specifically, the thick spacers are comprised of a nitride, an oxynitride or combinations and multilayers thereof.

The thick spacers are formed by a conventional deposition process such as CVD or plasma-assisted CVD, followed by etching. When the thick spacers are comprised of a combination of spacer materials, the spacer materials may be deposited sequentially followed by a single etching step, or alternatively, one spacer material is first deposited and etched, and thereafter a second spacer material is deposited and etched. This combination of spacer material deposition and etching may be repeated any number of times. The etching step used in forming thick spacers 24 is a highly anisotropic etching process which is capable of removing the spacer material from atop the oxide layer that lays above the patterned gate stack.

The term "thick spacers" is used herein to denote spacers that have a thickness of from about 2 to about 100 nm, with a thickness of from about 20 to about 80 nm being more highly preferred.

As stated above, and at this point of the present invention, the deep source/drain diffusion regions, may be formed by utilizing conventional ion implantation and annealing processes well known in the art.

Figure 1D:
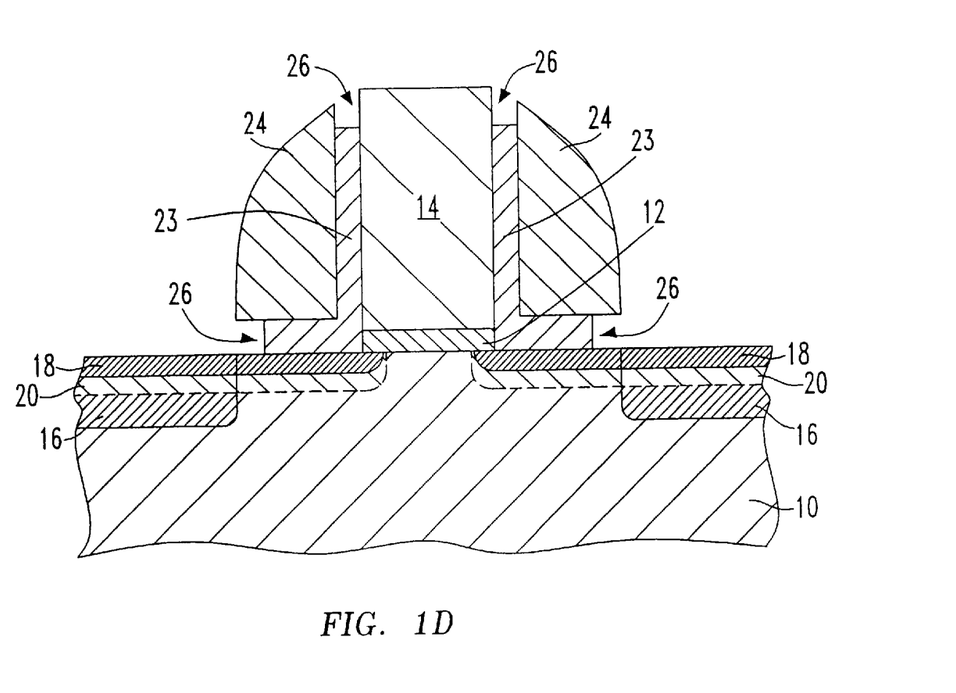

After forming thick spacers 24, the structure shown in FIG. 1C is then subjected to an etching step wherein oxide film 22 is recessed below the uppermost horizontal edge of thick spacers 24 providing the structure shown, for example, in FIG. 1D. Specifically, an etching step is employed in the present invention so as to provide divot regions 26 which exist between the thick spacers 24 and patterned gate stack 14. Optionally, the recessing process may be conducted laterally providing divot region 26 between the thick spacers and semiconductor substrate 10. Note this recessing step converts oxide film 22 into an L-shaped structures 23.

The etching process used in forming divots 26 in the structure includes a wet chemical etch process or a dry chemical etch process. When wet etching is employed in the present invention in forming divots 26, a chemical etchant such as HF that has a high selectivity for removing portions of the oxide film as compared with either the thick spacer material, the patterned gate stack and the semiconductor substrate is employed.

When dry etching is employed in forming the divots, the dry etching process includes any dry etch process which is also capable of selectively removing portions of the oxide film as compared with either the thick spacer material, the patterned gate stack and the semiconductor substrate is employed.

Figure 1E:
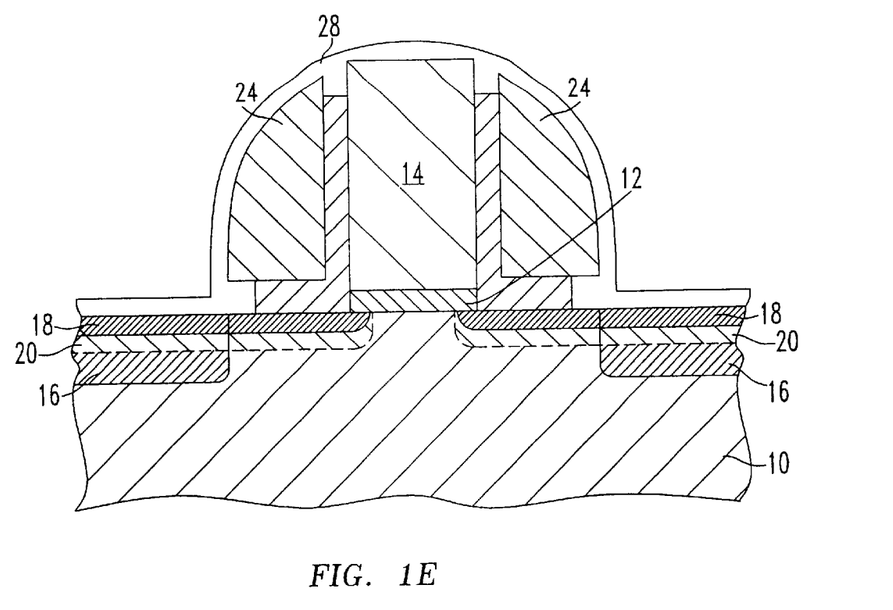

After recessing the oxide film, divot fill material 28 is formed by a conformal deposition process such as CVD or plasma-assisted CVD so as to provide the structure shown, for example, in FIG. 1E. The divot fill material includes a dielectric material other than an oxide, e.g., nitride, or oxynitride, that is not capable of being removed by a subsequent silicide precleaning or other processes which follow the processing steps of the present invention.

The thickness of the divot fill material is not critical to the present invention, but typically the thickness of the divot fill material is from about 4 to about 80 nm with a thickness of from about 10 to about 20 nm being more highly preferred.

The divot fill material is next etched back by utilizing a spacer type etching process or a combination of isotropic and anisotropic etches that removes the divot fill material from horizontal surfaces and possibly removes some of the divot fill material from the vertical surfaces so that the divot fill material is left completely or partially covering the recessed oxide film (both on the vertical and lateral portions). The etch back step results in the formation of the structure shown in FIG. 1F.

Figure 1F:
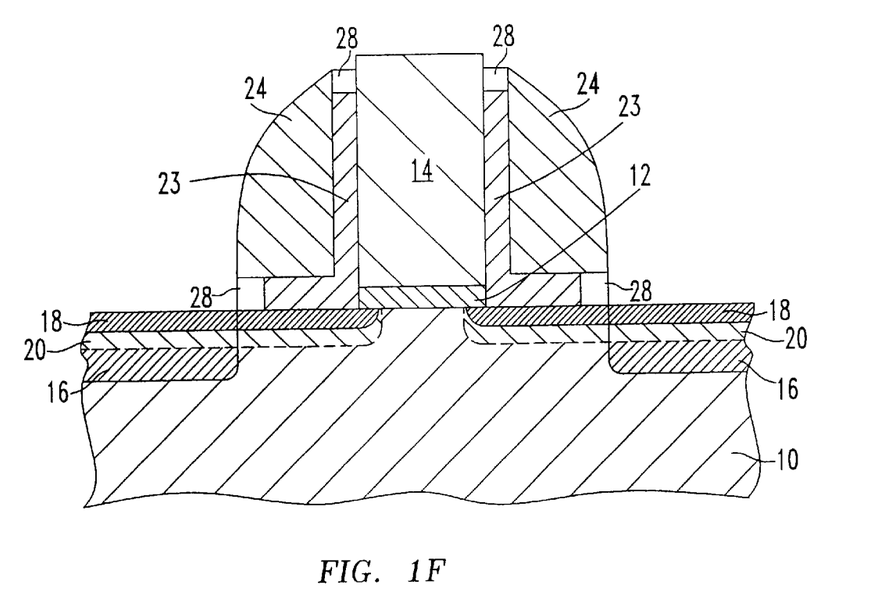

The silicidation process is performed after the structure illustrated in FIG. 1F is formed. Specifically, the silicidation process includes the steps of forming a refractory metal such as Co, Ni or Ti on the surface of semiconductor substrate 10, annealing the refractory metal under conditions that are capable of converting the refractory metal layer into a metal silicide layer, and, if needed, removing any non-reactant refractory metal from the structure.

In addition to silicidation, the present invention also contemplates other well known CMOS processing steps that are typically employed in the prior art. For example, the present invention also contemplates forming a metal contact to the metal silicide layer, and connecting the metal contact to an external contact.

Figure 2A:
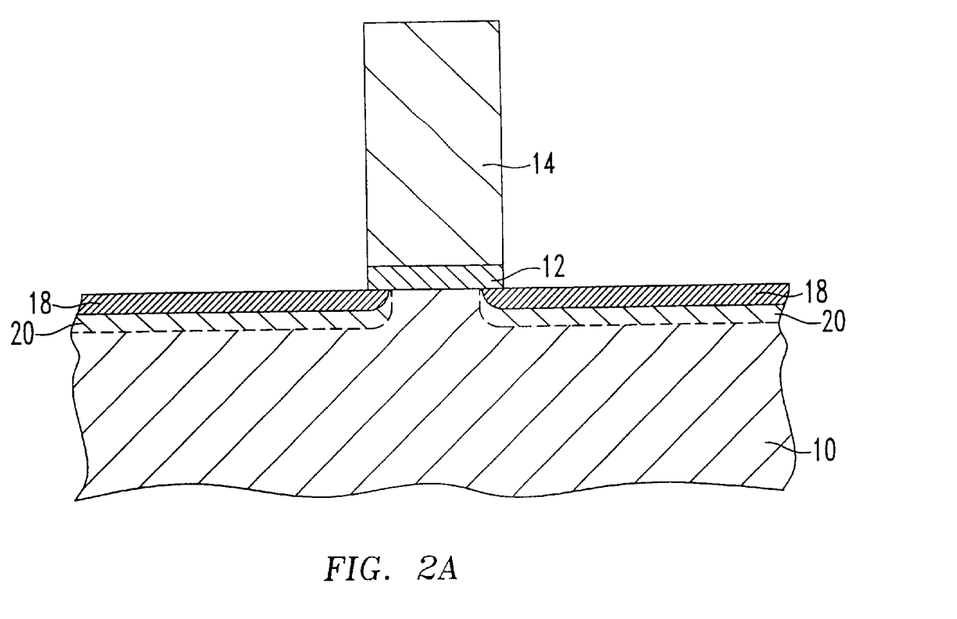
FIGS. 2A–2G are pictorial representations (through cross-sectional views) illustrating the inventive CMOS device through various processing steps employed in a second method of the present invention.

Reference will now be made to FIGS. 2A–2G which illustrate a second method of the present invention wherein an "I" shaped oxide film is employed as an extension and halo spacer. Specifically, FIG. 2A shows an initial structure that is employed in the second method of the present application. The initial structure includes semiconductor substrate 10, patterned gate dielectric 12 formed on a portion of semiconductor substrate 10, and patterned gate stack 14 formed atop patterned gate dielectric 12.

Note that the initial structure shown in FIG. 2A is identical to the one shown in FIG. 1A therefore no further details concerning the initial structure is needed herein. That is, the detailed description concerning the various elements of the structure shown in FIG. 2A as well as the processing steps used in forming the same are identical to that previously described in connection with FIG. 1A; therefore the above description regarding FIG. 1A is incorporated herein by reference.

After forming the initial structure shown in FIG. 2A, various ion implantation steps may be performed to implant source/drain extension regions and halo implant regions into the semiconductor substrate. Note that these implant regions are shown in FIG. 2A. Alternatively, the various implant steps may be postponed until after the structures shown in FIGS. 2B or 2C have been formed. The deep source/drain diffusion regions are again formed anytime after spacers 24 are present on the structure, i.e., after the formation of the structure shown in FIG. 2D.

Figure 2B:
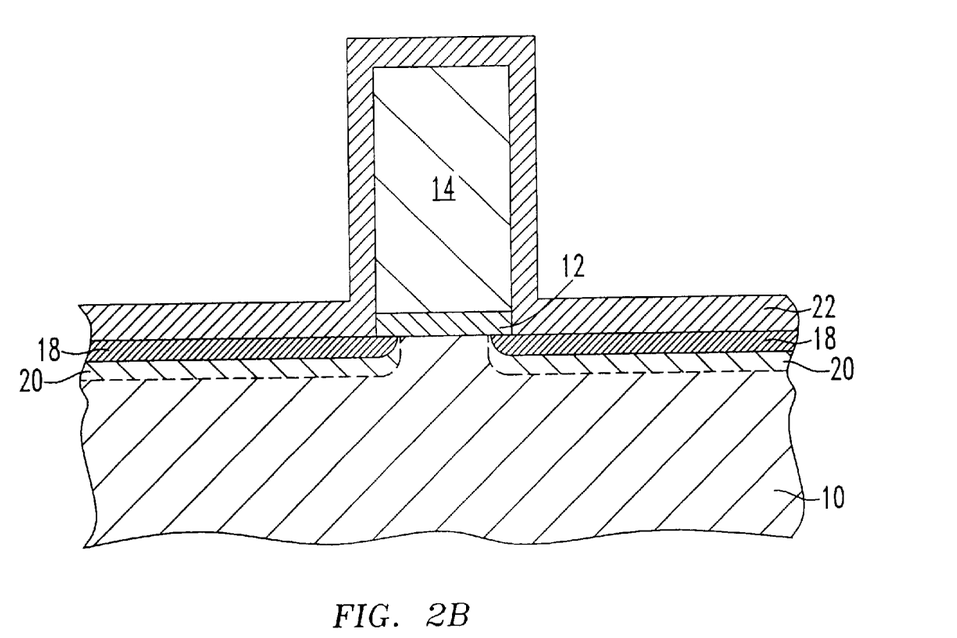

FIG. 2B shows the structure that is obtained after oxide film 22 is formed over the patterned gate region as well as the exposed surface of semiconductor substrate 10. In some embodiments of the present invention, oxide film 22 may include dopant ions such as nitrogen or fluorine incorporated therein via ion implantation so as to provide an oxide layer that has a modified dielectric constant. In a highly preferred embodiment of the present invention, oxide film 22 is comprised of $SiO_2$, which may or may not include dopant ions incorporated therein.

As mentioned previously herein, oxide film 22 is formed by a conventional deposition processes such as CVD and plasma-assisted CVD which are capable of forming a conformal oxide film on the structure. The thickness of oxide film 22 is not critical to the present invention, but typically oxide film 22 has a thickness of from about 2 to about 30 nm, with a thickness of from about 5 to about 15 nm being more highly preferred.

Figure 2C:
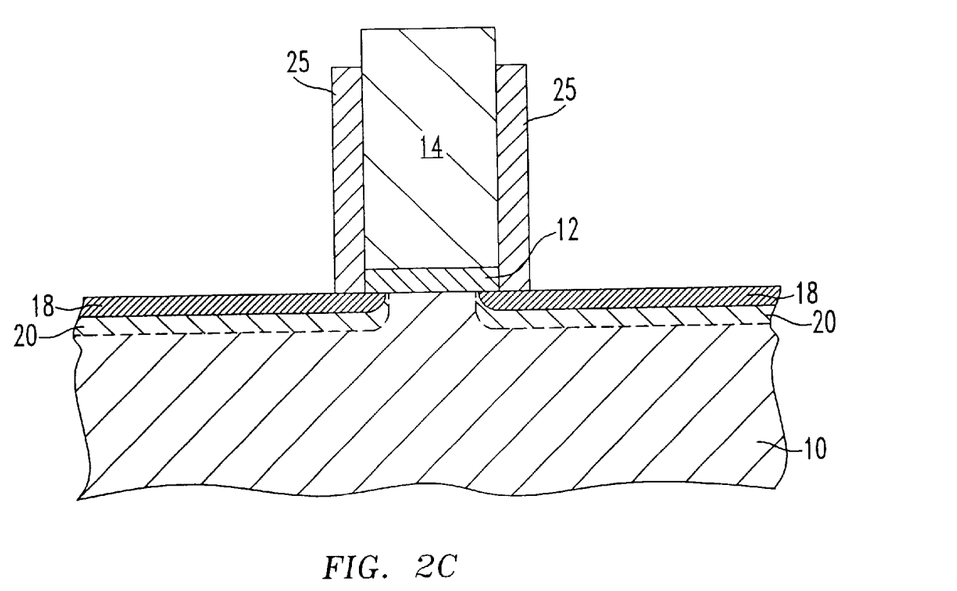

Following formation of the oxide film on the structure, a spacer etch step is performed so as to provide the structure shown in FIG. 2C. Note that the spacer etch forms "I" shaped oxide film 25 on the structure. Specifically, a spacer etching step is performed so as to convert oxide film 22 into "I" shaped spacers 25 which are present on at least a portion of the vertical sidewalls of the patterned gate stack. Note that in FIG. 2C, the I-shaped oxide spacers are not present on the upper portion of the patterned gate stack.

In accordance with the present invention, the I-shaped oxide spacers are formed by utilizing an etching process that is highly anisotropic so that the dielectric film is removed from all horizontal surfaces, but still remains on substantially all the vertical surfaces. A conventional reactive ion etching process or any other like dry etching process may be utilized in etching oxide film 22 into I-shaped oxide spacers 25.

Figure 2D:
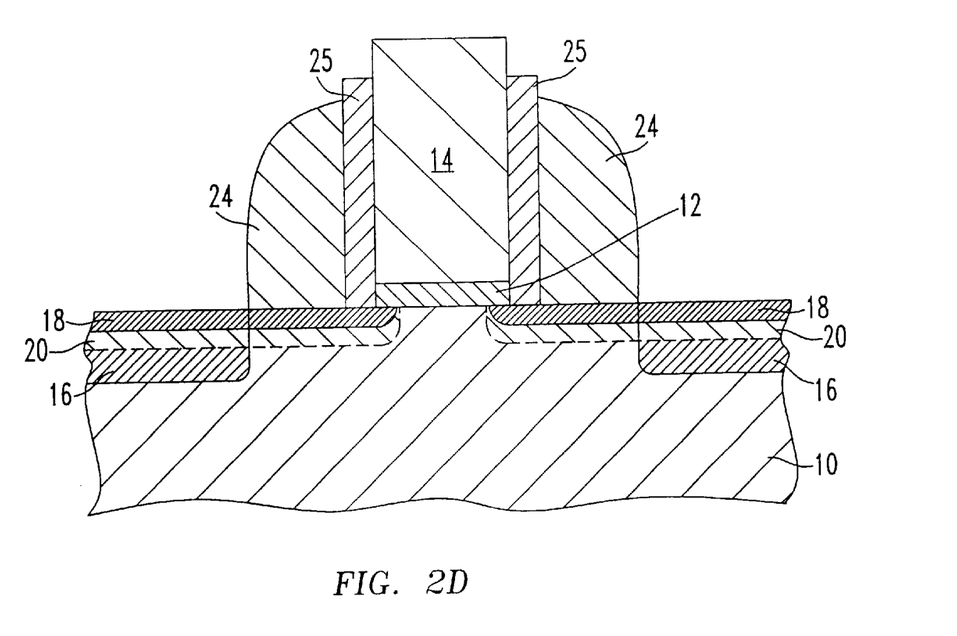

Next, thick spacers 24, which may be comprised of a single spacer material or a combination of spacer materials, are formed on the structure such that the structure shown in FIG. 2D is formed. The thick spacers are comprised of a dielectric material, such as a nitride, or an oxynitride, which is different from I-shaped oxide spacers 25. For example, when the thin spacers are comprised of $SiO_2$, then the thick spacers are formed of a nitride (e.g., $Si_3N_4$) or oxynitride (e.g., SiON). Note that thick spacers 24 are formed utilizing the processing steps mentioned hereinabove, e.g., deposition and etching.

At this point of the present invention, deep source/drain diffusion regions 16 may be formed in the substrate (for either NFET, PFET or both) utilizing conventional ion implantation and annealing processes well known to those skilled in the art.

Figure 2E:
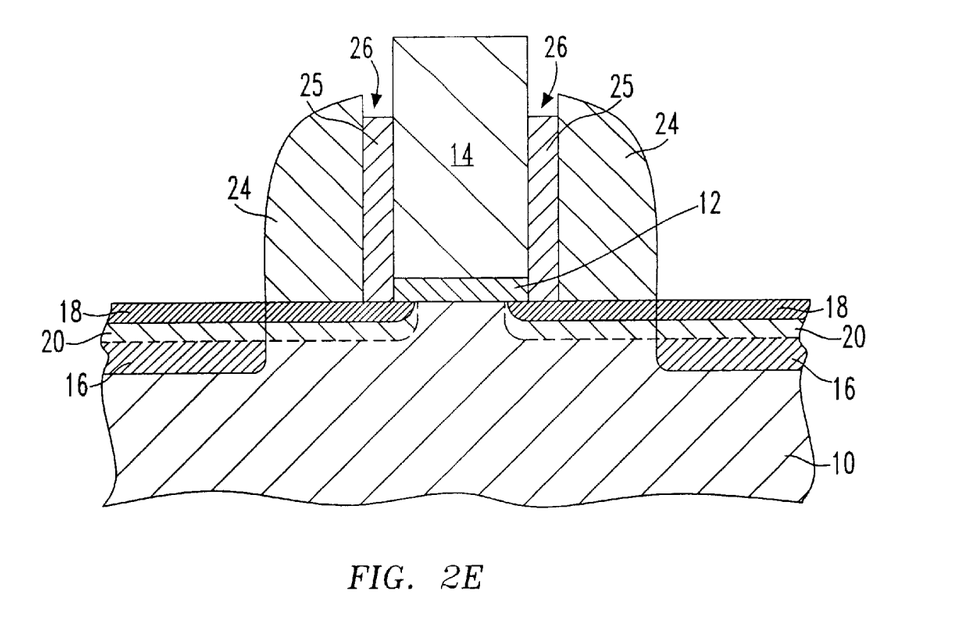

FIG. 2E shows the structure wherein I-shaped oxide spacers 25 are recessed to a level below that of the thick spacers so as to form divot region 26 in the structure. The oxide spacer recessing step may be carried out by a wet chemical etching process which includes the use of a chemical etch such as HF that has a high selectivity for recessing oxide spacer 25 as compared with thick spacer 24. Note that the I-shaped spacers are recessed below the top most edge of the thick spacers.

The recess may also be achieved by utilizing a dry etching process that is capable of etching oxide spacer 25 but is selective to the gate stack material, the thick spacers and the semiconductor substrate.

Figure 2F:
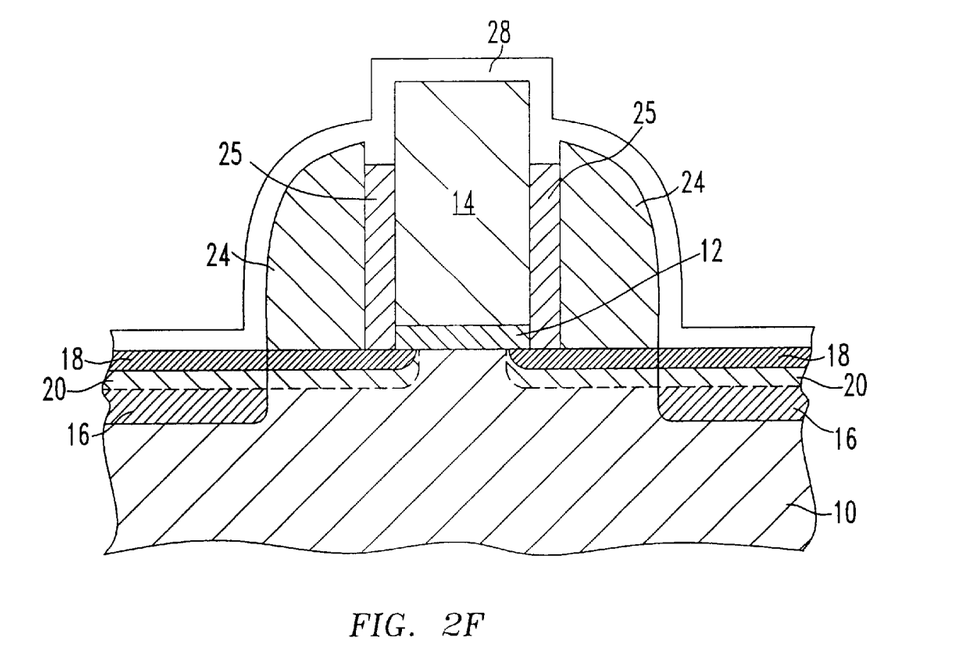

FIG. 2F shows the structure that is obtained after divot fill material 28 is formed on all exposed surfaces of the structure. The divot fill material includes the same material as mentioned previously in respect to the first method of the present invention and it is formed utilizing one of the above mentioned processing steps.

Figure 2G:
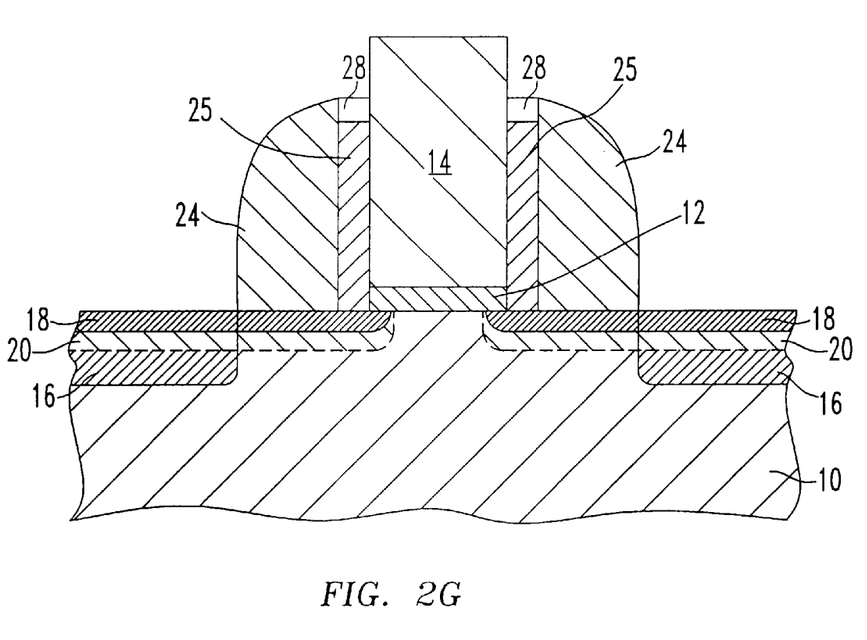

FIG. 2G shows the structure that is obtained after the divot fill material has been subjected to the above-mentioned etch back process. Specifically, the etch back process may include a spacer type etching process or a combination of isotropic etching and anisotropic etching that removes some of the material from the vertical surfaces so that the divot fill material is left completely or partially covering oxide spacers 25.

The silicidation process is performed after the structure illustrated in FIG. 2G is formed. Specifically, the silicidation process includes the steps of forming a refractory metal such as Co, Ni or Ti on the surface of semiconductor substrate 10, annealing the refractory metal under conditions that are capable of converting the refractory metal layer into a metal silicide layer, and, if needed, removing any non-reactant refractory metal from the structure.

In addition to silicidation, the present invention also contemplates other well known complementary oxide semiconductor (CMOS) processing steps that are typically employed in the prior art. For example, the present invention also contemplates forming a metal contact to the metal silicide layer, and connecting the metal contact to an external contact.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A complementary metal oxide semiconductor (CMOS) device comprising:
   a semiconductor substrate having at least one patterned gate stack region formed thereon, said patterned gate stack region having vertical sidewalls and comprising a patterned gate stack located atop a patterned gate dielectric;
   an oxide film having at least an exposed lateral edge formed on portions of said vertical sidewalls of said at least one patterned gate stack region as well as surface portions of said semiconductor substrate;
   thick spacers formed on said oxide film, wherein said thick spacers extend beyond said at least exposed lateral edge of said oxide film such that a divot region is present between at least said thick spaces and a top surface of said patterned gate stack region; and
   a divot fill material present in said divot region.

2. The CMOS device of claim 1 wherein said semiconductor substrate comprises Si, Ge, SiGe, GaAs, InAs, InP, Si/Si, Si/SiGe or silicon-on-insulators.

3. The CMOS device of claim 1 wherein said semiconductor substrate comprises Si.

4. The CMOS device of claim 1 wherein said patterned gate dielectric is comprised of an oxide, a nitride, an oxynitride or any combination and multilayer thereof.

5. The CMOS device of claim 1 wherein said patterned gate dielectric is comprised of an oxide selected from the group consisting of $SiO_2$, $ZrO_2$, $Ta_2O_5$ and $Al_2O_3$.

6. The CMOS device of claim 1 wherein said gate stack includes at least a gate material.

7. The CMOS device of claim 6 wherein said gate material is selected from the group consisting of polysilicon, amorphous silicon, elemental metals that are conductive, alloys of elemental metals that are conductive, suicides or nitrides of elemental metals that are conductive and any combination thereof.

8. The CMOS device of claim 6 wherein said gate material is comprised of silicon or amorphous silicon.

9. The CMOS device of claim 1 wherein said oxide film is comprised of $SiO_2$.

10. The CMOS device of claim 1 wherein said oxide film is an L-shaped spacer.

11. The CMOS device of claim 1 wherein said thick spacers are comprised of a nitride, an oxynitride or any combinations or multilayers thereof.

12. The CMOS device of claim 1 wherein said divot fill material is comprised of a nitride or an oxynitride.

13. A CMOS device comprising:
   a semiconductor substrate having at least one patterned gate stack region formed thereon, said patterned gate stack region having vertical sidewalls and comprising a patterned gate stack located atop a patterned gate dielectric;
   an oxide film having at least an exposed lateral edge formed on portions of said vertical sidewalls of said at least one patterned gate stack region;
   thick spacers formed on said oxide film and said semiconductor substrate, wherein said thick spacers extend beyond said at least exposed lateral edge of said oxide film such that a divot region is present between at least said thick spacers and a top surface of said patterned gate stack region; and
   a divot fill material present in said divot region.

14. The CMOS device of claim 13 wherein said semiconductor substrate comprises Si, Ge, SiGe, GaAs, InAs, InP, Si/Si, Si/SiGe or silicon-on-insulators.

15. The CMOS device of claim 13 wherein said semiconductor substrate comprises Si.

16. The CMOS device of claim 13 wherein said patterned gate dielectric is comprised of an oxide, a nitride, an oxynitride or any combination and multilayer thereof.

17. The CMOS device of claim 13 wherein said patterned gate dielectric is comprised of an oxide selected from the group consisting of $SiO_2$, $ZrO_2$, $Ta_2O_5$ and $Al_2O_3$.

18. The CMOS device of claim 13 wherein said gate stack includes at least a gate material.

19. The CMOS device of claim 18 wherein said gate material is selected from the group consisting of polysilicon, amorphous silicon, elemental metals that are conductive, alloys of elemental metals that are conductive, silicides or nitrides of elemental metals that are conductive and any combination thereof.

20. The CMOS device of claim 18 wherein said gate material is comprised of silicon or amorphous silicon.

21. The CMOS device of claim 13 wherein said oxide film is comprised of $SiO_2$.

22. The CMOS device of claim 13 wherein said oxide film is an I-shaped spacer.

23. The CMOS device of claim 13 wherein said thick spacers are comprised of a nitride, an oxynitride or any combinations or multilayers thereof.

24. The CMOS device of claim 13 wherein said divot fill material is comprised of a nitride or an oxynitride.

* * * * *